United States Patent
Jacobson et al.

(10) Patent No.: US 7,019,558 B1
(45) Date of Patent: Mar. 28, 2006

(54) CONVERSION OF CONFIGURATION DATA TO MATCH COMMUNICATION PROTOCOL

(75) Inventors: Neil G. Jacobson, Los Altos, CA (US); Emigdio M. Flores, Jr., Coral Springs, FL (US); Sanjay Srivastava, San Jose, CA (US); Bin Dai, Mountain View, CA (US); Sungnien Jerry Mao, Fremont, CA (US); Rosa M. Y. Chow, Redwood City, CA (US); Pushpasheel Tawade, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 54 days.

(21) Appl. No.: 10/891,159

(22) Filed: Jul. 14, 2004

(51) Int. Cl.
*H03K 19/173* (2006.01)

(52) U.S. Cl. ............................. 326/38; 326/37; 326/39

(58) Field of Classification Search ............ 326/37–41, 326/46
See application file for complete search history.

(56) References Cited

U.S. PATENT DOCUMENTS

| 6,828,823 B1* | 12/2004 | Tsui et al. ..................... 326/40 |
| 2003/0020512 A1* | 1/2003 | Mantey et al. ................ 326/38 |

* cited by examiner

*Primary Examiner*—Anh Q. Tran
(74) *Attorney, Agent, or Firm*—LeRoy D. Maunu; Justin Liu

(57) ABSTRACT

Various approaches for converting configuration data for programmable circuits are disclosed. In one embodiment, a first configuration bitstream is provided. The first configuration bitstream has a format compatible with a first protocol for communicating with and configuring the programmable circuit. A second protocol is selected for communicating with and configuring the programmable circuit, and the first configuration bitstream is converted to a second configuration bitstream. The second configuration bitstream has a format compatible with the second protocol. The programmable circuit is configured with the second configuration bitstream.

20 Claims, 4 Drawing Sheets

CONVERSION OF CONFIGURATION DATA TO MATCH COMMUNICATION PROTOCOL

FIELD OF THE INVENTION

The present invention generally relates to configuring programmable devices.

BACKGROUND

A programmable device such as a programmable logic device (PLD) may be configured to perform a variety of functions. The function of a PLD for a particular application is determined by the configuration data loaded into the PLD. A PLD component may support multiple communication protocols to load configuration data from a configuration file. Each communication protocol may require a configuration file with a format specific to the communication protocol, or require that the configuration file contain parameters, such as configuration clock rate, that are specific to the communication protocol and the type of PLD component.

Different communication protocols for configuring a PLD may be used at different times in the life cycle of a design. For example, one protocol may be desirable during testing of the design on the PLD, another protocol may be desirable during system initialization when the PLD is part of a complete system, and yet another protocol may be desirable for use by field engineers.

Switching the communication protocol used to configure a PLD in an application may require generation of the configuration file appropriate for the communication protocol and type of PLD component. The system and tools needed to generate the configuration file may not be readily available, thus making complete generation of the configuration file inconvenient.

The flexibility of PLD components has led to their widespread adoption by the electronics industry. Elimination of any inconvenience in using PLD components increases the flexibility of PLD components, and thus the usefulness of PLD components to the electronics industry.

The present invention may address one or more of the above issues.

SUMMARY OF THE INVENTION

The various embodiments of the invention provide a number of approaches for converting configuration data for programmable logic circuits. In one embodiment, a first configuration bitstream is provided. The first configuration bitstream has a format compatible with a first protocol for communicating with and configuring the programmable circuit. A second protocol is selected for communicating with and configuring the programmable circuit, and the first configuration bitstream is converted to a second configuration bitstream. The second configuration bitstream has a format compatible with the second protocol. The programmable circuit is configured with the second configuration bitstream.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of configuration of a field programmable gate array (FPGA). Those skilled in the art will appreciate, however, that the invention may be implemented in other devices such as FPGAS having different architectures, types of programmable logic devices (PLDs) other than FPGAs, and integrated circuits that include programmable circuitry and/or are adapted to various application requirements, based on both volatile and non-volatile technologies.

Figure 1:
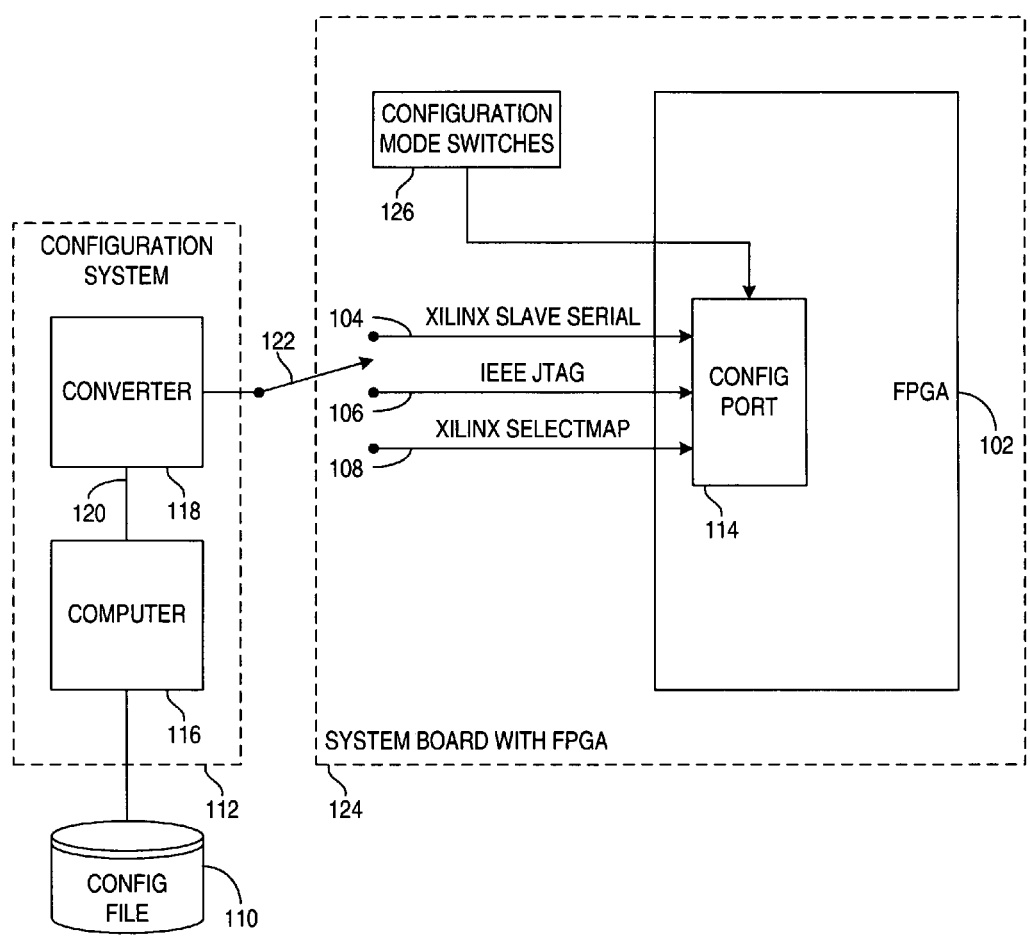
FIG. 1 is a system diagram showing an example of selection of the communication protocol for FPGA configuration.

FIG. 1 is a system diagram showing an example of selection of the communication protocol for an example PLD such as a field programmable gate array (FPGA) 102. One of the communication protocols, for example, Xilinx slave serial (line 104), IEEE Standard 1149.1 (more commonly known as JTAG) (line 106), or Xilinx SelectMAP (line 108), may be selected to configure the FPGA 102. The FPGA 102 may be configured with data from a configuration file 110 by a configuration system 112.

The configuration port 114 of the FPGA 102 may support multiple configuration protocols (shown as lines 104, 106, and 108) with dedicated FPGA 102 input/output pins for each configuration protocol, thereby providing the user with flexible options for configuration of the FPGA 102. A user can select a configuration protocol that is suitable for implementing user requirements and may modify the selected configuration protocol in response to changing requirements.

The Xilinx slave serial configuration protocol has configuration data serially supplied from configuration file 110. The configuration file 110 for use with Xilinx slave serial 104 may have a format that reflects the bit-oriented transfer of configuration data. In addition, the actual configuration data may reflect specific device settings that must be loaded to ensure correct function in this communications mode. The Xilinx slave serial protocol may also be used in loading configuration data from an alternative source, such as a serial PROM.

Standard 1149.1 defines a communication protocol (and associated interface hardware) in which control and data may be serially supplied. In addition to device configuration, the 1149.1 protocol may be used for testing purposes such as boundary scan of the input/output pins of FPGA 102. Because of these multiple purposes, usage of the 1149.1 protocol for FPGA 102 configuration may require additional data in the configuration file 110 to route the configuration data to the appropriate destination within the FPGA. In addition, the actual configuration data may reflect specific device settings that must be loaded to ensure correct function in this communications mode.

The Xilinx SelectMAP protocol is a configuration protocol with configuration data supplied in parallel to multiple pins of FPGA 102. Supplying the configuration data in parallel may provide faster configuration of FPGA 102 than the other example configuration protocols. The configuration file 110 used with the SelectMAP protocol may have a format that supports the parallel transfer of configuration data. In addition, the actual configuration data may reflect specific device settings that must be loaded to ensure correct function in this communications mode. In general, the format of data in the configuration file 110 may depend upon the configuration protocol such as the three example configuration protocols described above. Note that these example configuration protocols shown in FIG. 1 and described above are merely examples of possible configuration protocols, and that other protocols may be available. In addition, other embodiments may include fewer or more protocols.

The configuration system 112 may include a computer 116 coupled to a converter 118. The converter converts configuration data (e.g., from a configuration file 110) from one communication protocol, such as RS232, parallel port, or Universal Serial Bus, on line 120 to a configuration protocol such as Xilinx slave serial, 1149.1, or Xilinx parallel SelectMAP. The converter 118 may convert to one or multiple configuration protocols.

Converter 118 is coupled to a system board 124, for example via cable 122, for each configuration protocol provided by the converter 118. A user may select a configuration protocol by selecting the download cable 122 to couple to FPGA 102. The coupling of the download cable 122 to the FPGA 102 may be done by connecting the selected cable 122 to a connector for the corresponding configuration protocol on the system board 124. A separate connector may be provided for each configuration protocol supported by the FPGA 102 and system board 124. In other embodiments, one or more configuration protocols may share one or more connectors or interfaces. A system board 124 may supply connectors for fewer configuration protocols than the configuration protocols supported by FPGA 102, thereby limiting the readily available configuration protocols.

In addition to selecting and connecting a download cable 122, a system board 124 mode switch 126 setting consistent with the selected download cable 122 may need to be provided. The setting of the mode switch 126 allows the user to notify the FPGA 102 of the selected configuration protocol. Alternatively, mode selection logic on system board 124 may be controllable by configuration system 112 via cable 122, allowing user input to the computer 116 to notify the FPGA 102 of the selected configuration protocol.

The selected configuration protocol may change with the user requirements during the lifecycle stages of system 124. For example, the SelectMAP protocol may be selected for quick configuration during initial development of system 124 because configuration update may need to be performed repeatedly. The 1149.1 protocol may be selected to additionally access test features during system verification. The Xilinx slave serial protocol may be selected during product release to verify correct configuration from a serial PROM. Note that a production system may replace the configuration system 112 with a serial PROM as the default source of configuration data.

The 1149.1 protocol may again be selected for test feature access during debug of a problem encountered by an end user with a production system 124. Usage of the Xilinx SelectMAP protocol may be prohibited for a production system 124 because the connector for the SelectMAP protocol may not be loaded on the system board 124 to reduce production costs associated with system 124.

Each stage in the lifecycle of a system 124 may have different users with different capabilities, such as a configuration system 112 supporting different configuration protocols. For example, the testing of a system updated by a development user to correct a defect discovered by an end user may require a field application engineer to configure the system using the 1149.1 configuration protocol. If the configuration file 110 provided by the user corresponds to a different configuration protocol, such as the Xilinx SelectMAP protocol, resolution of the problem may be delayed unless the field application engineer can expeditiously convert the format of the configuration file from the SelectMAP protocol to the 1149.1 protocol.

System 124 may permit configuration by multiple configuration protocols over a single download cable 122. Mode selection logic on system board 124 may be controlled by configuration system 112 via download cable 122 to select the desired configuration protocol. Alternatively, the mode selection logic may be integrated into the configuration port 114 of FPGA 102. Selection of the configuration protocol may be achieved in such systems by user input to computer 116.

Figure 2:
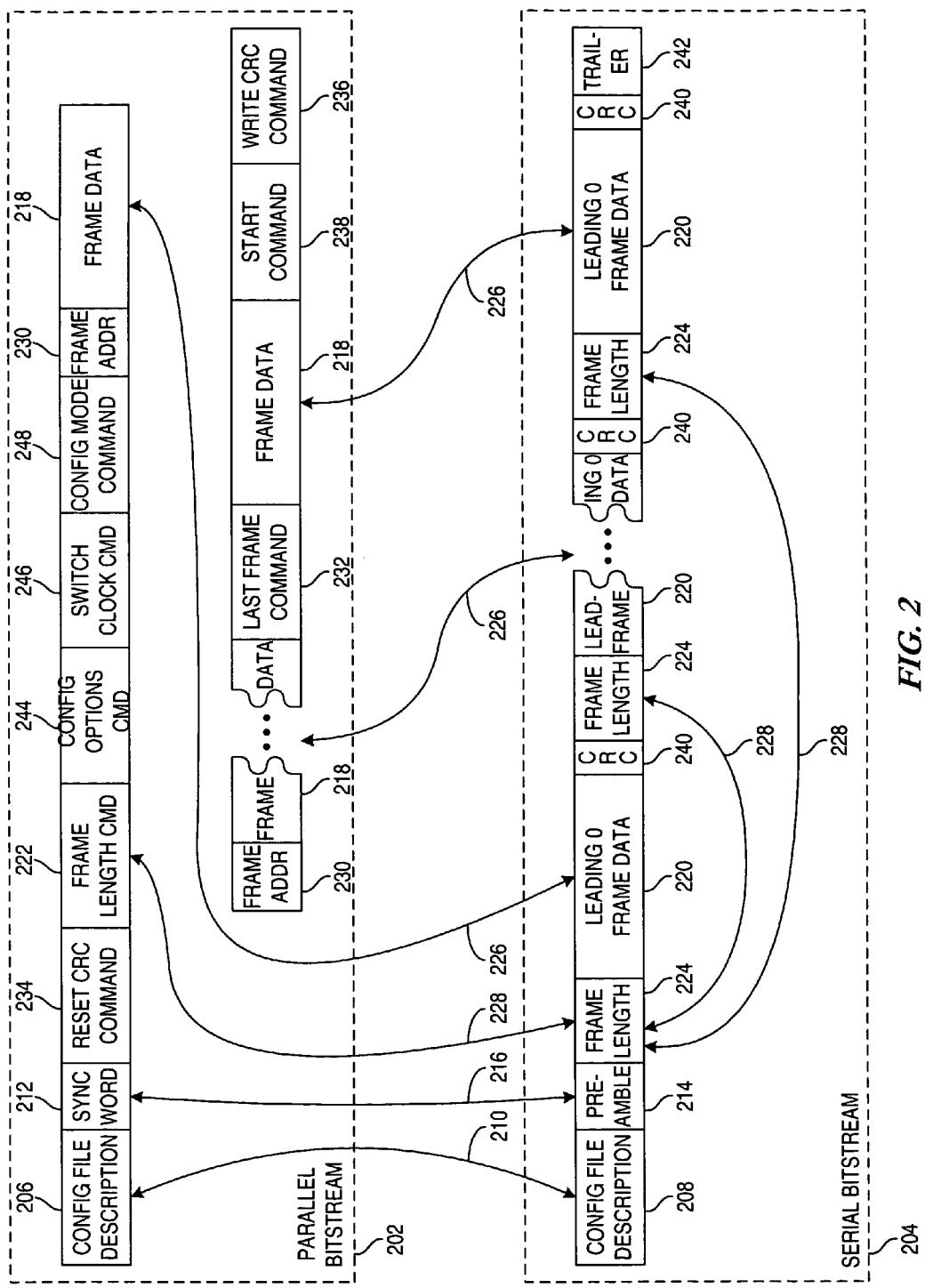
FIG. 2 is a diagram showing examples of the structure of configuration files for parallel and serial modes of configuration communication.

FIG. 2 is a diagram showing examples of the structure of configuration files (bitstreams 202 and 204) for parallel and serial modes of configuration communication. The example format of a parallel bitstream 202 for a parallel configuration protocol, such as Xilinx SelectMAP, may be a word-oriented structure with control and data fields aligned to 32-bit word boundaries. The example format of a serial bitstream 204 for a serial configuration protocol, such as Xilinx slave serial, may be a bit oriented structure with control and data fields of various unaligned bit lengths.

The parallel bitstream 202 and the serial bitstream 204 may have descriptive headers 206 and 208, respectively. The optional headers 206 and 208 may contain descriptive information for the configuration file, and may include design name, target device, names and versions for configuration file generation tools, and generation date.

Conversion of a bitstream from one format to another is illustrated by bi-directional lines that connect corresponding information in the parallel bitstream 202 and the serial bitstream 204. Conversion (line 210) of the parallel header 206 to the serial header 208 may copy the parallel header 206 while adding a special comment character to the beginning of each header line, if necessary, and ensuring that resulting header 208 ends with an end-of-line character. Conversion (line 210) of the serial header 208 to the parallel header 206 may copy the serial header 208, pad the header to a multiple of 4 ASCII characters, and ensure that the pattern of the synchronization word 212 does not appear in the resulting parallel header 206. This conversion may also include modification of the bitstream contents to set the internal device state appropriately to accept data in this mode and format. It may also change the behavior of the device as appropriate for this mode.

The 32-bit synchronization word 212 of the parallel bitstream 202 contains a special pattern that is not allowed to appear in the header 206. The synchronization word allows the bitstream 202 to be sent to the FPGA, including the header 206, with the FPGA ignoring data before the synchronization word 212.

For a serial bitstream 204, the header 208 is removed by the configuration system before the serial bitstream 204 is sent to the FPGA. The preamble 214 contains a special ASCII character that is not the comment character.

In converting the parallel bitstream 202 to the serial bitstream 204, the synchronization word 212 is replaced (line 216) with the 8-bit preamble character 214. In converting the serial bitstream 204 to the parallel bitstream 202, the preamble character 214 is recognized at the beginning of a text line and replaced (line 216) with the 32-bit synchronization word 212.

The configuration data may be held in the frame data fields 218 for the parallel bitstream 202 and in frame data fields 220, with a leading zero for the serial bitstream 204. The actual length of the data frame accepted by the FPGA is specified by a frame length command 222 for the parallel bitstream 202, and each parallel frame of data 218 is rounded up to a length that is a multiple of 32-bits. Typically, a parallel bitstream 202 has one 64-bit frame length command 222. The serial frame data fields 220 are the actual length of the data frame accepted by the FPGA as specified in a 24-bit frame length field 224 for each frame plus 1-bit for the leading zero.

To convert (line 226) parallel frame data 218 to serial frame data 220, the parallel frame data 218 is truncated to the length specified in the preceding frame length command 222, and a leading zero is added. To convert (line 226) serial frame data 220 to parallel frame data 218, the leading zero is removed, and zero padding is appended to round the length up to the next multiple of 32-bits.

To convert (line 228) a frame length command 222 in a parallel bitstream 204 to frame length fields 224 in a serial bitstream 204, the 27-bit frame length is extracted from the frame length command 222, the most significant 3 bits of this length are verified to be zero, and a 24-bit frame length field 224 is output for each subsequent parallel frame data 218 that is converted to serial frame data 220.

To convert (line 228) the frame length fields 224 for a serial bitstream 204 to a frame length command 222 for a parallel bitstream 202, a frame length command 222 containing the length from a frame length field 224 is output for the first frame length field 224 and any subsequent frame length field 224 that does not have a length matching the previous frame length field 224.

Each parallel frame data 218 has a preceding frame address 230 in the parallel bitstream 202 except for the last frame of data 218. The last frame has a preceding last frame command 232 that contains the last frame address. The frame address 230 and the last frame address in the last frame command 232 permit re-configuration of a portion of a frame. For a configuration file, the parallel bitstream 202 usually has a value of zero for the frame address 230 and the last frame address in the last frame command 232. Thus, during conversion of a parallel bitstream 202 to a serial bitstream 204, each frame address 230 and the last frame address in the last frame command 232 are verified to be zero. During conversion of a serial bitstream 204 to a parallel bitstream 202, each frame address 230 and the last frame address in the last frame command 232 are set to zero.

For a parallel bitstream 202, a cyclic redundancy check (CRC) for the bitstream may be calculated over the bitstream after a 64-bit reset CRC command 234 and inclusive of the frame data 218 following a 64-bit last frame command 232. The calculated 16-bit CRC value is included in a 64-bit write CRC command 236. A 64-bit start command 238 is included in the parallel bitstream 202 to start normal operation of the FPGA when the CRC calculated over the bitstream received by the FPGA matches the CRC included in the following write CRC command 236. Conversion of a serial bitstream 204 to a parallel bitstream 202 requires calculating the 16-bit CRC for the write command 236.

For a serial bitstream 204, a 4-bit CRC 240 may be calculated for each frame data 220. A serial bitstream 204 has an 8-bit trailer character 242 with a special value. During conversion of a parallel bitstream 202 to a serial bitstream 204, the 4-bit CRC 240 values are calculated and the trailer character 242 is appended.

A parallel bitstream 202 may have multiple 64-bit commands, including configuration options command 244, switch clock command 246, and configuration mode command 248 to enhance configuration. For example, the clocking rate may be specified in the configuration options command 244, and the clocking rate may be modified by the FPGA in response to the switch clock command 246 to allow faster configuration with a higher clock rate. The maximum clock rate may be dependent upon the FPGA device and may also be dependent upon constraints provided by the configuration system or constraints provided by user input.

In general, default values may be given to the parameters in the configuration enhancement commands 244, 246, and 248. The parameters may include, for example, the start-up mechanism and timing, port enable, port speed, and port persistence settings. During the conversion of a serial bitstream 204 to a parallel bitstream 202 the default values may be used. Alternatively, to provide parameter values to enhance configuration, the FPGA device type may be used to validate any parameter values available from a source configuration file such as serial bitstream 204. The FPGA device type may be obtained from a descriptive header, such as the serial descriptive header 208, by querying the IDCODE of the FPGA or by prompting the user to provide the device type.

Examples have been provided for the structure of a parallel bitstream 202 and a serial bitstream 204, and techniques to convert between these two structures 202 and 204 have been discussed. Other configuration protocols may have additional structures for their configuration files. In general, conversion between any two structures is possible, but optimized conversion may require input from the user or additional information such as the target FPGA for the configuration data.

Figure 3:
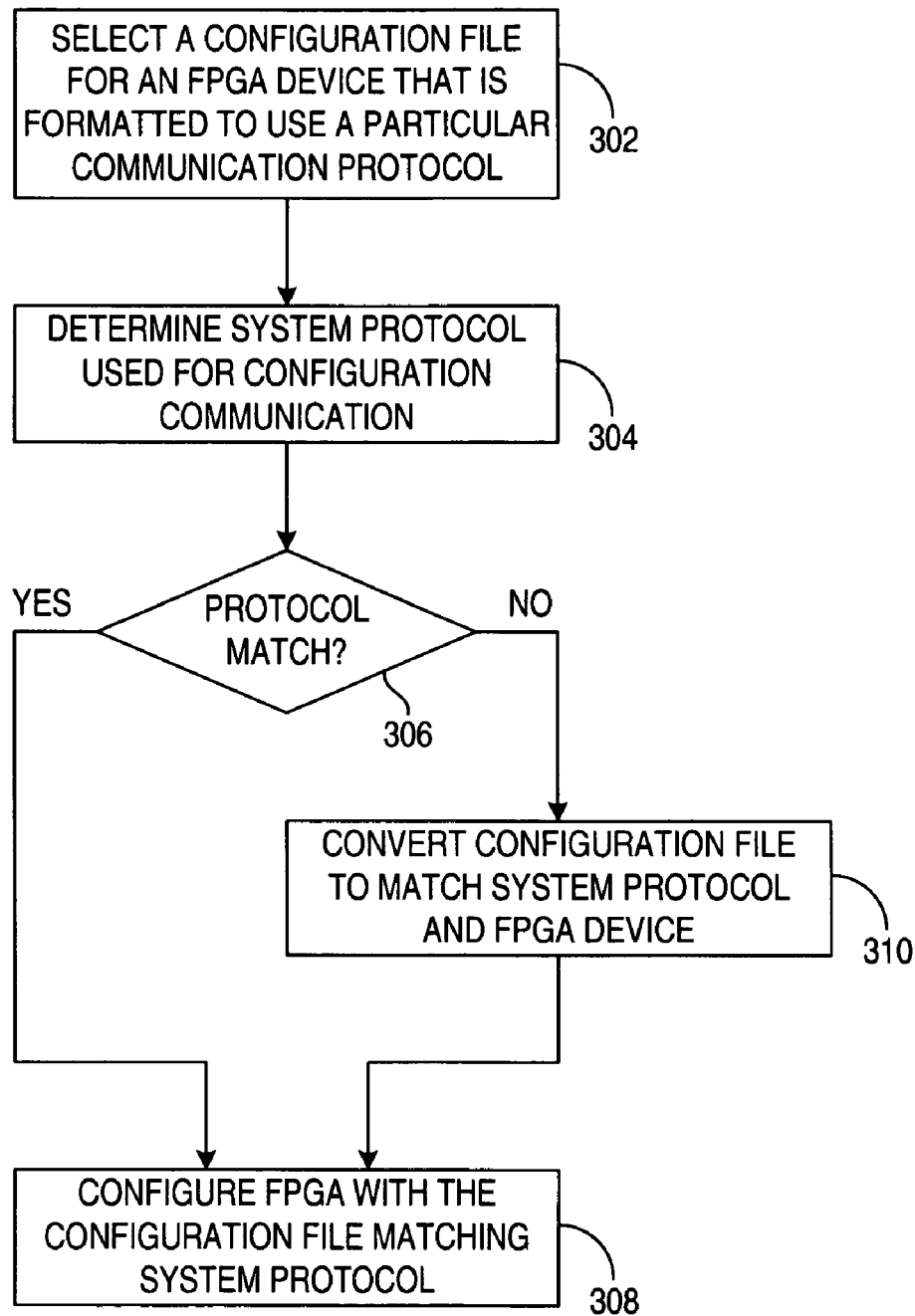
FIG. 3 is a flow diagram an example process for conversion of a configuration file to match the communication protocol used for configuration in accordance with various embodiments of the invention.

FIG. 3 is a flow diagram of an example process for converting a configuration file to match the communication protocol used for configuration. At step 302 the user may begin the FPGA configuration by specifying a configuration file. The user may select the configuration file from a list of available configuration files provided on a user interface of a configuration system. The selected configuration file may be formatted with a structure appropriate for a particular configuration protocol or protocols. The structure for a file may be determined by the file name extension or by file contents at selected locations such as values in the header, preamble, or data fields. A check may be made that the file name extension is consistent with the file contents.

At step 304, the configuration system may automatically determine the configuration protocol or protocols available. The configuration system may determine the available protocols by querying the device for a response using each possible protocol. For example, the configuration system may try to read a register, such as the IDCODE register, using each possible protocol with the IDCODE response value checked for a recognized manufacturer and part number. A check may also be made for whether any IDCODE received matches any device type specified in the header of the configuration file. Alternatively, user input at a user interface of the configuration system may specify the available configuration protocols.

The decision 306 checks whether the selected configuration file has a structure that matches one of the available protocols. When the configuration file has such a matching structure, the process proceeds to step 308 and the FPGA is configured with the configuration file using an appropriate one of the matching protocols. When the structure of the configuration file does not match an available protocol the process may proceed to step 310.

At step 310 the structure of the configuration file may be converted to a structure appropriate for an available configuration protocol. The user may be prompted on a user interface of the configuration system to approve the conversion, or to select the target conversion structure when multiple configuration protocols are available. Alternatively, conversion may be automatic. The configuration file conversion may use the device type as determined from the IDCODE, the configuration file header, or prompted user input. After converting the configuration file, the process proceeds to step 308 and the FPGA is configured with the converted configuration file.

Figure 4:
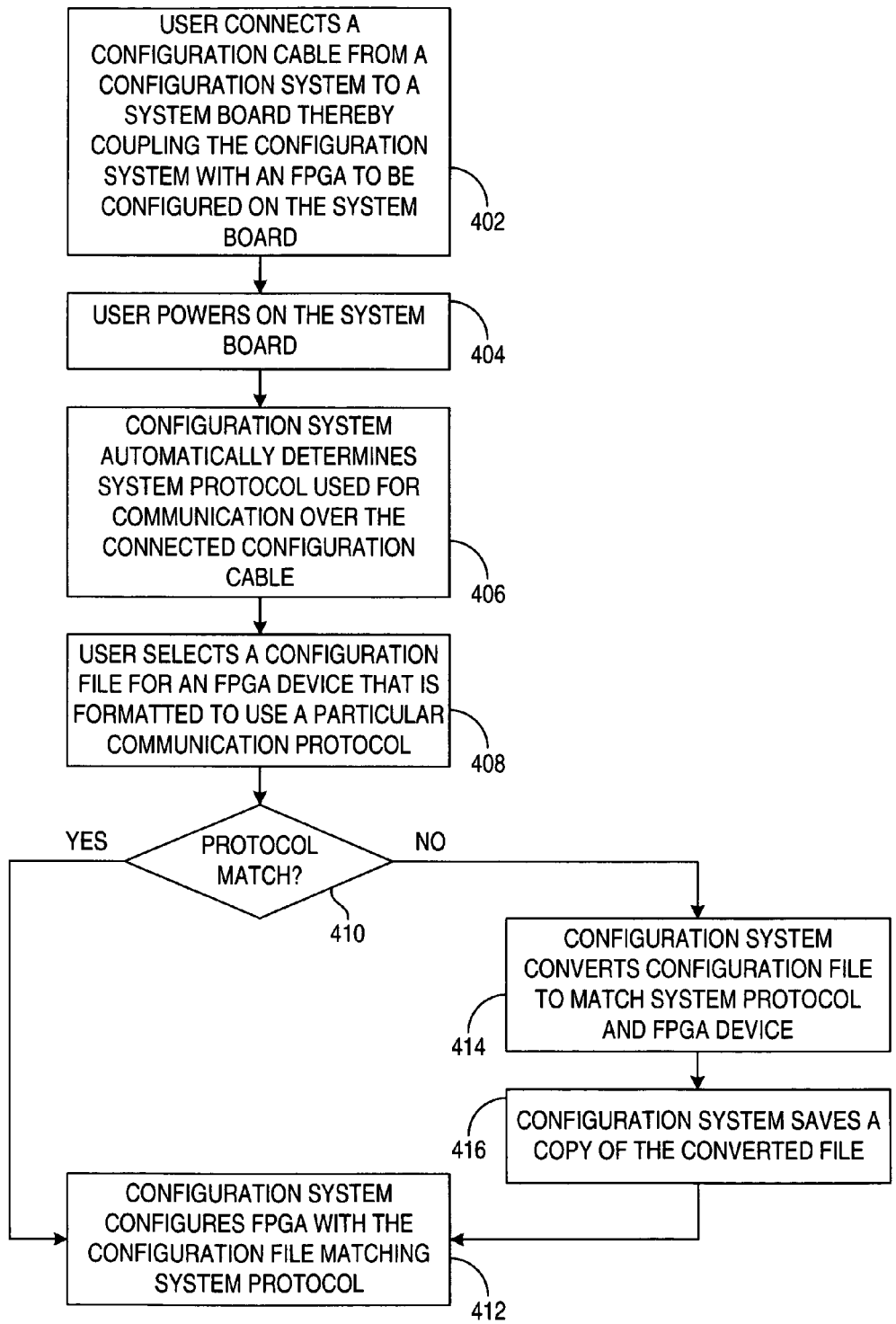
FIG. 4 is a flow diagram of an example detailed process for conversion of a configuration file to match the communication protocol used for configuration in accordance with various embodiments of the invention.

FIG. 4 is a flow diagram of an example detailed process for conversion of a configuration file to match the communication protocol used for configuration. The flow diagram of FIG. 4 illustrates various additional and alternative details to the embodiments illustrated in FIG. 3. At step 402 the user selects the available configuration protocols by coupling at least one download cable from a configuration system to an FPGA on a system board. At step 404, the user powers on the system board and thus the FPGA on the system board.

The configuration system may automatically determine the available communication protocol or protocols for FPGA configuration at step 406. The system board may contain selection logic to specify the configuration protocol with the selection logic controllable by the configuration system via a download cable. The configuration system may query for an FPGA device response for each possible selection logic setting of the configuration protocol.

At step 408, the user selects a configuration file. The selected configuration file is checked for a match with one of the available configuration protocols at decision 410. When the selected configuration file matches one of the available configuration protocols, the process proceeds to step 412, and the configuration system configures the FPGA with the configuration file using one of the matching protocols. When the selected configuration file does not match one of the available configuration protocols, the process proceeds to step 414.

At step 414 the configuration system may convert the configuration system to match an available configuration protocol. The user may be prompted at a user interface of the configuration system to approve the configuration file conversion. The user may have the option of instead selecting a different configuration file that does match one of the available configuration protocols. The user may have the option of instead generating a new configuration file that matches one of the available configuration protocols from the design specification. Note that a user may not have access to the design specification used to generate a configuration file. Embodiments of the invention allow successful configuration of an FPGA when the user does not have access to the design specification and an existing configuration file does not match an available configuration protocol.

The configuration system may save a copy of the converted file at step 416 before configuring the FPGA on the system board with the converted configuration file at step 412.

The present invention is believed to be applicable to a variety of systems for configuring programmable devices such as PLDs and has been found to be particularly applicable and beneficial in converting a configuration bitstream from one format to another based on user and system requirements. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for configuring a programmable circuit, comprising:

providing a first configuration bitstream having a first format compatible with a first protocol for communicating with and configuring the programmable circuit;

selecting a second protocol for communicating with and configuring the programmable circuit;

converting the first configuration bitstream to a second configuration bitstream having a second format compatible with the second protocol; and configuring the programmable circuit with the second configuration bitstream.

2. The method of claim 1, wherein the selecting step comprises:

initiating configuration of the programmable circuit via each of a plurality of protocols for communicating with and configuring the programmable circuit until a selection is made; and selecting the second protocol in response to a signal from the programmable circuit indicating recognition of the second protocol.

3. The method of claim 2, wherein the selecting step includes inputting data by a user that specifies the second protocol.

4. The method of claim 1, further comprising storing the second configuration bitstream.

5. The method of claim 1, further comprising:

generating cyclic-redundancy check (CRC) data from data in the second configuration bitstream; and storing the CRC data in the second configuration bitstream.

6. The method of claim 1, further comprising:

determining a type of the programmable circuit;

determining whether values of parameters in the first configuration bitstream used in controlling configuration of a programmable circuit are valid for the determined type programmable circuit; and denying configuration of the programmable circuit in response to the values of the parameters being invalid for the determined type programmable circuit.

7. The method of claim 1, further comprising:

determining a type of the programmable circuit;

determining whether values of parameters in the first configuration bitstream used in controlling configuration of a programmable circuit are compatible for the determined type programmable circuit;

changing at least one of the parameter values from a first value from the first configuration bitstream to a second value compatible with the programmable circuit in response to the first value of the at least one parameter being incompatible with the determined type programmable circuit; and writing the second value to the second configuration bitstream.

8. The method of claim 7, wherein the determining step includes reading type identifier data from the first configuration bitstream.

9. The method of claim 7, wherein the determining step includes reading type identifier data from the programmable circuit.

10. The method of claim 7, wherein the determining step includes soliciting type identifier data from a user.

11. The method of claim 1, further comprising:
determining whether the first configuration bitstream is compatible with the programmable circuit; and
denying configuration of the programmable circuit in response to the first configuration bitstream being incompatible with the programmable circuit.

12. The method of claim 1, further comprising:
determining whether the first configuration bitstream is compatible with the programmable circuit;
denying configuration of the programmable circuit in response to the first configuration bitstream being incompatible with the programmable circuit;
generating cyclic-redundancy check (CRC) data from data in the second configuration bitstream; and
storing the CRC data in the second configuration bitstream.

13. The method of claim 12, further comprising:
determining a type of the programmable circuit;
determining whether values of parameters in the first configuration bitstream used in controlling configuration of a programmable circuit are valid for the determined type programmable circuit; and
denying configuration of the programmable circuit in response to the values of the parameters being invalid for the determined type programmable circuit.

14. The method of claim 12, further comprising:
determining a type of the programmable circuit;
determining whether values of parameters in the first configuration bitstream used in controlling configuration of a programmable circuit are compatible for the determined type programmable circuit;
changing at least one of the parameter values from a first value from the first configuration bitstream to a second value compatible with the programmable circuit in response to the first value of the at least one parameter being incompatible with the determined type programmable circuit; and
writing the second value to the second configuration bitstream.

15. The method of claim 14, wherein the determining step includes reading type identifier data from the first configuration bitstream.

16. The method of claim 14, wherein the determining step includes reading type identifier data from the programmable circuit.

17. The method of claim 14, wherein the determining step includes soliciting type identifier data from a user.

18. The method of claim 1, further comprising coupling the programmable circuit to a configuration system.

19. The method of claim 18, wherein the step of selecting the second protocol is based on the coupling step.

20. A system for configuring a programmable circuit, comprising:
means for providing a first configuration bitstream having a first format compatible with a first protocol for communicating with and configuring the programmable circuit;
means for selecting a second protocol for communicating with and configuring the programmable circuit;
means for converting the first configuration bitstream to a second configuration bitstream having a second format compatible with the second protocol; and
means for configuring the programmable circuit with the second configuration bitstream.

* * * * *